United States Patent
Liu et al.

(10) Patent No.: US 8,975,135 B2
(45) Date of Patent: Mar. 10, 2015

(54) ANALOG FLOATING-GATE CAPACITOR WITH IMPROVED DATA RETENTION IN A SILICIDED INTEGRATED CIRCUIT

(71) Applicant: Texas Instruments Incorporated, Dallas, TX (US)

(72) Inventors: Kaiping Liu, Plano, TX (US); Amitava Chatterjee, Plano, TX (US); Imran Mahmood Khan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/301,766

(22) Filed: Jun. 11, 2014

(65) Prior Publication Data
US 2014/0295631 A1   Oct. 2, 2014

Related U.S. Application Data

(62) Division of application No. 13/534,865, filed on Jun. 27, 2012, now Pat. No. 8,779,550.

(51) Int. Cl.
| | |
|---|---|
| *H01L 21/8242* | (2006.01) |
| *H01L 29/66* | (2006.01) |
| *H01L 27/06* | (2006.01) |
| *H01L 27/08* | (2006.01) |

(52) U.S. Cl.
CPC ...... *H01L 29/66181* (2013.01); *H01L 27/0629* (2013.01); *H01L 27/0805* (2013.01)
USPC ............ 438/248; 438/239; 438/393; 438/397

(58) Field of Classification Search
CPC ..................... H01L 29/66181; H01L 27/0805; H01L 27/0629; H01L 28/40; H01L 28/60; H01L 27/1203; H01L 27/10894; H01L 29/94; H01L 27/105; H01L 21/76254; H01L 21/84; H01L 29/7833; H01L 28/55; H01L 27/11507; H01L 27/11502; H01L 28/75; H01L 21/31122; H01L 21/32136; C23C 14/08
USPC ................................. 438/239, 248, 393, 397
See application file for complete search history.

(56) References Cited

U.S. PATENT DOCUMENTS 6,617,204 B2 * 9/2003 Sung et al. .................... 438/197

OTHER PUBLICATIONS

Ahuja et al., "A Very High Precision 500-nA CMOS Floating-Gate Analog Voltage Reference", J. Solid-State Circ., vol. 40, No. 12 (IEEE, Dec. 2005), pp. 2364-2372.

(Continued)

*Primary Examiner* — Michelle Mandala
(74) *Attorney, Agent, or Firm* — Jacqueline J. Garner; Frederick J. Telecky, Jr.

(57) ABSTRACT

An analog floating-gate electrode in an integrated circuit, and method of fabricating the same, in which trapped charge can be stored for long durations. The analog floating-gate electrode is formed in a polycrystalline silicon gate level, and includes portions serving as a transistor gate electrode, a plate of a metal-to-poly storage capacitor, and a plate of poly-to-active tunneling capacitors. A silicide-block film comprised of a layer of silicon dioxide underlying a top layer of silicon nitride blocks the formation of silicide cladding on the electrode, while other polysilicon structures in the integrated circuit, such as polysilicon-to-metal capacitors, are silicide-clad. Following silicidation, a capacitor dielectric is deposited over the remaining polysilicon structures, followed by formation of an upper metal plate.

13 Claims, 6 Drawing Sheets

(56) References Cited

OTHER PUBLICATIONS

Lande et al., "An Analog Floating-Gate Memory in a Standard Digital Technology", Proceedings of the Fifth International Conf. on Microelectronics for Neural Networks (IEEE, 1996), pp. 271-276.

U.S. Appl. No. 13/070,263, filed Mar. 23, 2011, entitled "Unitary Floating-Gate Electrode with Both N-Type and P-Type Gates", commonly assigned.

U.S. Appl. No. 13/070,222, filed Mar. 23, 2011, entitled "Low Leakage Capacitor for Analog Floating-Gate Integrated Circuits".

* cited by examiner

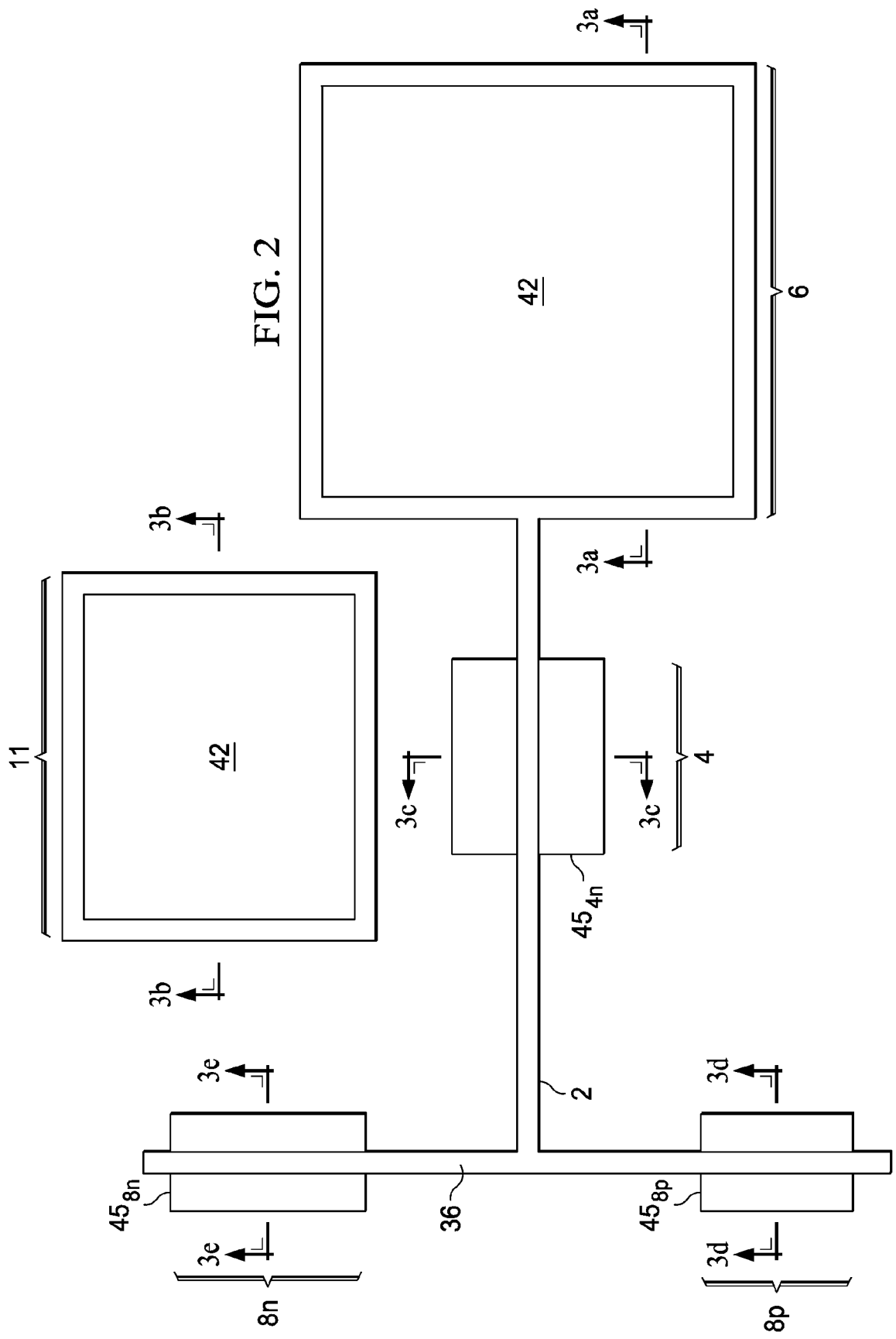

ANALOG FLOATING-GATE CAPACITOR WITH IMPROVED DATA RETENTION IN A SILICIDED INTEGRATED CIRCUIT

CROSS-REFERENCE TO RELATED APPLICATIONS

This application is a divisional of U.S. Nonprovisional patent application Ser. No. 13/534,865, filed Sep. 27, 2012, now U.S. Pat. No. 8,779,550, issued Jul. 15, 2014, the contents of which are herein incorporated by reference in its entirety.

BACKGROUND OF THE INVENTION

This invention is in the field of semiconductor integrated circuits. Embodiments of this invention are more specifically directed to capacitor structures that define analog voltages in such integrated circuits.

An important type of semiconductor integrated circuits are circuits that implement analog circuit functions, in which input and output signals and information are communicated and processed in the analog domain. Typically, analog integrated circuit functions rely on reference levels (voltages and currents) that are established and regulated on-chip. Proper functioning of the analog integrated circuit, and particularly such functioning over variations in power supply voltage, temperature, and other operating conditions, often critically depends on the stability of reference voltages and currents over such variations. However, manufacturing variations reflected in physical parameters of the integrated circuits can affect the reference levels as generated in these integrated circuits. Accordingly, many analog integrated circuits include some ability to "trim" or adjust the on-chip precision reference circuits, as well as other circuit functions within those integrated circuits. Trimming is typically performed at manufacture, after electrical measurement or other evaluation of the performance of the raw circuit as manufactured.

Recently, programmable non-volatile memory elements have been considered for use as trimming elements, for example in replacement of fuses or antifuses. Examples of these non-volatile memory elements include floating-gate metal-oxide-semiconductor (MOS) transistors, in which the state of the transistor is defined by charge trapped at a floating gate electrode, such as a floating capacitor plate. Programming of the device is accomplished through such mechanisms as Fowler-Nordheim tunneling, and hot carrier injection. Programming of floating-gate structures is attractive as a trimming technique because of the precision with which charge may be programmed according to modern programming methods, and also because the programming operation can be carried out by purely electrical means.

However, trimming of circuit parameters by way of floating-gate elements requires retention of the trapped charge at the floating gate for the life of the device, considering that the trimming may only be performed at the time of manufacture. Conventional capacitor dielectric films in analog integrated circuits have been observed, in connection with this invention, to exhibit some degree of leakage over time. An example of such a conventional capacitor dielectric is silicon nitride deposited by plasma-enhanced chemical vapor deposition (PECVD). As such, the use of floating-gate capacitor technology in conventional analog circuits would require additional costly processes such as deposition of dielectric films specifically for the programmable capacitors, deposition and patterning of an additional conductor layer, and the like.

Ahuja et al., "A Very High Precision 500-nA CMOS Floating-Gate Analog Voltage Reference", J. Solid-State Circ., Vol. 40, No. 12 (IEEE, December 2005), pp. 2364-72 describes the use of floating-gate technology in precision analog reference circuits. In this article, the floating-gate device is constructed as a double-level polysilicon device. Tunneling regions between the two polysilicon levels is formed as a 400 Å film of silicon dioxide. It is believed that the manufacturing process implemented into this structure is relatively costly, given the requirement that a separate tunneling oxide film be deposited. In addition, this approach uses a relatively thick tunneling oxide film, which results in a relatively small capacitance per unit area.

Copending and commonly assigned U.S. application Ser. No. 13/070,222, filed Mar. 23, 2011, entitled "Low Leakage Capacitor for Analog Floating-Gate Integrated Circuits", and incorporated herein by reference, describes an analog floating-gate electrode in an integrated circuit. As described therein, the analog floating-gate electrode is formed as a unitary polycrystalline silicon gate element with portions serving as a transistor gate electrode, a plate of a metal-to-poly storage capacitor, and plates of poly-to-active tunneling capacitors. Silicide-block silicon dioxide blocks the formation of silicide cladding on the electrode, while other polysilicon structures in the integrated circuit are silicide-clad.

BRIEF SUMMARY OF THE INVENTION

Embodiments of this invention to provide a programmable floating-gate element for an analog circuit, and method of fabricating the same, in which element has robust data retention capability in light of subsequent processes in the analog manufacturing process flow.

Embodiments of this invention provide such an element and method in which the floating-gate element comprises a plate of a capacitor exhibiting low leakage over time.

Embodiments of this invention provide such an element and method in which consistent data retention capability is provided among a population of capacitors formed in the same integrated circuit, and over a population of integrated circuits.

Embodiments of this invention provide such an element and method in which other capacitors with a plate in the same level as the floating-gate element have high capacitance per unit area.

Embodiments of this invention provide such an element and method that is compatible with high voltage circuit applications.

Other objects and advantages of embodiments of this invention will be apparent to those of ordinary skill in the art having reference to the following specification together with its drawings.

Embodiments of this invention may be implemented into an integrated circuit including a high-performance circuit with polysilicon gate electrodes and capacitor plates that are clad with a metal silicide such as cobalt silicide, and a method of making the same. In such an integrated circuit, a floating gate electrode in that same polysilicon gate level is protected from direct react silicidation by a silicide-block film. A portion of the floating gate electrode overlies an active region with a gate dielectric therebetween, and serves as a plate of a storage capacitor, the other plate of which is formed of a metal or metal nitride plate, with the silicon block film and another dielectric film therebetween. The silicide-block film comprises a layer of silicon dioxide underlying a top layer of silicon nitride; the silicide-block film is removed from the polysilicon plate of the high-performance circuit capacitor.

Following silicidation of the polysilicon plate of the high-performance circuit capacitor, a capacitor dielectric film is formed over the silicided polysilicon plate and the silicide-block film of the storage capacitor plate. A metal or metal compound element forms a top plate of both capacitors, such that the storage capacitor has a dielectric of the silicide-block film and the capacitor dielectric film overlying a non-silicided polysilicon plate, and the high-performance circuit capacitor has a dielectric of the capacitor dielectric film overlying a silicided polysilicon plate.

BRIEF DESCRIPTION OF THE SEVERAL VIEWS OF THE DRAWING

FIG. 2 is a plan view of the physical construction of the device of FIG. 1, according to an embodiment of the invention.

DETAILED DESCRIPTION OF THE INVENTION

The present invention will be described in connection with one or more of its embodiments, namely as implemented into an analog circuit that can be programmably adjusted after manufacture, because it is contemplated that this invention will be especially beneficial when used in such an application. However, it is also contemplated that this invention can provide important benefits in other circuit and structure applications, including integrated circuits with electrically-erasable programmable read-only memory (EEPROM) functions, of either the "flash" and "non-flash" types. Accordingly, it is to be understood that the following description is provided by way of example only, and is not intended to limit the true scope of this invention as claimed.

Figure 1:
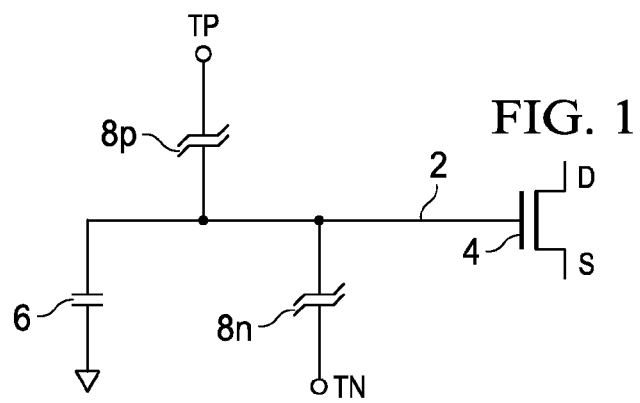
FIG. 1 is an electrical diagram, in schematic form, of a programmable floating gate device constructed according to embodiments of the invention.

FIG. 1 illustrates an electrical schematic incorporating analog floating-gate electrode 2 according to embodiments of this invention. In this example, analog floating-gate electrode 2 is a single electrode serving multiple functions. Electrode 2 serves as the gate electrode for metal-oxide-semiconductor (MOS) transistor 4, and as a first plate of storage capacitor 6. Transistor 4 may be at an input of an analog circuit or other function, such as an amplifier or the like. A second plate of storage capacitor 6 is coupled to a reference voltage, namely ground in this example. In operation, the voltage stored across storage capacitor 6 determines the voltage at the gate of MOS transistor 4, and thus the extent to which transistor 4 conducts between drain D and source S, for a given drain-to-source bias.

In embodiments of this invention, analog floating-gate electrode 2 can be programmed to a particular analog state by way of tunnel capacitors 8p, 8n. Analog floating-gate electrode 2 serves also as a first plate of each of these tunnel capacitors 8p, 8n. In this example, a second plate of tunnel capacitor 8p is connected to a terminal TP, while a second plate of tunnel capacitor 8n is connected to a terminal TN. The capacitor dielectric for tunnel capacitors 8p, 8n is contemplated to be relatively thin, to allow mechanisms such as Fowler-Nordheim tunneling to transfer charge between terminals TP, TN and analog floating-gate electrode 2, depending on the bias.

In operation, the programming of analog floating-gate electrode 2 by electrons tunneling through tunnel capacitor 8n is performed by applying a pulse of an appropriate negative voltage to terminal TN, relative to the voltage at terminal TP and to the ground reference voltage at the opposite plate of storage capacitor 6. An example of such a "programming" pulse, for a fully programmed level, is a voltage of about −11 volts at terminal TN relative to terminal TP and ground, for on the order of 20 msec. The voltage divider of capacitors 8n, 8p, 6 will result in most of that voltage appearing across tunnel capacitor 8n, enabling electrons to tunnel through its capacitor dielectric to analog floating-gate electrode 2. Those electrons will remain trapped at analog floating-gate electrode 2, considering that there is no direct (i.e., DC) connection between analog floating-gate electrode 2 and any other circuit element. Conversely, electrons can be removed from analog floating-gate electrode 2 by tunneling through tunnel capacitor 8p to terminal TP, upon application of an appropriate positive voltage at terminal TP relative to terminal TN and to the ground reference voltage at the opposite plate of storage capacitor 6. The voltage divider of capacitors 8n, 8p, 6 will result in most of that voltage appearing across tunnel capacitor 8p, enabling electrons to tunnel through its capacitor dielectric from analog floating-gate electrode 2. An example of such a "erase" pulse, to remove a fully programmed level, is a voltage of about +11 volts at terminal TP relative to terminal TN and ground, for on the order of 20 msec. The duration of the program and erase pulses can be adjusted to precisely set the charge state at analog floating-gate electrode 2. The charge trapped at analog floating-gate electrode 2 will thus define the voltage across storage capacitor 6, and thus the voltage at the gate of MOS transistor 4. Tunnel capacitors 8n, 8p thus enable precise setting of the charge at analog floating-gate electrode 2, and thus precise adjustment of the analog state of the circuit including MOS transistor 4.

It is contemplated that the analog floating gate structure of embodiments of this invention can be advantageously implemented in various circuit environments, including reference voltage circuits, programmable gate array structures, trim capability for analog circuits and reference circuits in digital circuits, level shift circuits, multi-bit EEPROM memory cells (i.e., in which each floating gate memory cell is capable of storing intermediate levels), and the like. Those skilled in the art having reference to this specification will readily comprehend these, and other, alternative uses of embodiments of this invention.

FIG. 2 illustrates, in plan view, the construction of an analog floating-gate structure such as that electrically shown in FIG. 1, according to an embodiment of this invention. Corresponding FIGS. 3a through 3e illustrate, in cross-section, the construction of the various structures shown in FIG. 2. Of course, in those circuits in which multiple analog floating-gate electrodes are to be implemented, each of those analog floating-gate electrodes will be constructed similar to one another. It is contemplated that the sizes of elements shown in FIGS. 2 and 3a through 3e are not necessarily to scale, relative to one another. For example, the element widths shown in FIG. 2 may in actuality be substantially narrower, relative to the length of the same element, than that shown. Similarly, the relative thicknesses of elements in the cross-sectional views of FIGS. 3a through 3e may not correspond to that in actual devices. In any case, it is contemplated that this embodiment of the invention may be implemented using relatively aggressive manufacturing technology, extending into the sub-micron regime. It is therefore contemplated that those skilled in the art having reference to this specification will be readily able to adapt the structures of FIG. 3 and FIGS. 3a through 3e in the desired manufacturing technology, without undue experimentation.

Figure 3A:
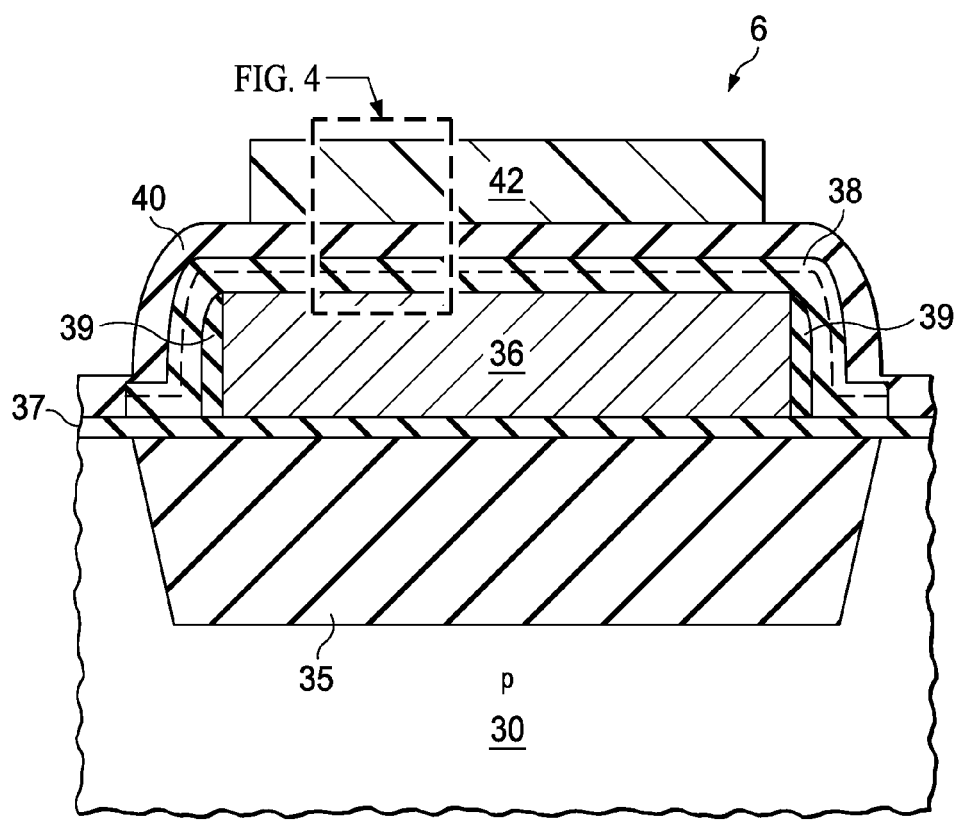
FIGS. 3a through 3e are cross-sectional views of the device of FIG. 2, according to that embodiment of the invention.

As shown in FIG. 2, analog floating-gate electrode 2 is constructed of polycrystalline silicon (polysilicon) element 36, which extends over the surface of a semiconductor wafer (or over a semiconductor surface layer, in the silicon-on-insulator context) to reach multiple devices or components. Polysilicon element 36 is typically doped to a desired conductivity type and concentration, to be conductive to the desired extent. For purposes of n-channel MOS transistor 4, and tunnel capacitors 8p, 8n, n-type doping of polysilicon element 36 is preferred. Polysilicon element 36 has a widened portion at one end, serving as a lower plate of storage capacitor 6. Referring to FIG. 3a, the lower plate portion of polysilicon element 36 overlies isolation dielectric structure 35, which is typically formed of silicon dioxide, deposited into a shallow trench previously etched into the semiconductor surface. Gate dielectric 37, for example formed of deposited silicon dioxide, is disposed between the surface of isolation dielectric structure 35 and polysilicon element 36. In this example, the surface into which isolation dielectric structure 35 is formed is the top surface of p-type silicon substrate 30. The upper plate of storage capacitor 6 is formed of tantalum nitride (TaN) plate 42, which overlies the widened portion of polysilicon element 36 at this location. In this embodiment of the invention, the capacitor dielectric is formed of silicide-block film 38 disposed at the top surface of polysilicon element 36, with capacitor dielectric layer 40 disposed over silicon dioxide layer 38. Silicon nitride elements 39 are disposed along the sidewalls of polysilicon element 36, underlying silicide-block film 38.

As known in the art, many integrated circuits are constructed to include a metal silicide cladding at certain silicon structures, such as transistor gate electrodes and polysilicon interconnects, to improve the conductivity of those structures. Conventionally, this metal silicide cladding is performed by direct reaction of a metal (e.g., cobalt, titanium, tungsten, tantalum) deposited over the silicon structures to be silicide-clad, followed by a high temperature anneal to react the deposited metal with the underlying silicon. An etch is then performed to remove the unreacted metal from those locations at which the metal was not in contact with underlying silicon (e.g., over isolation dielectric structures 35 or gate dielectric 37). As known in the art, a dielectric material can be previously deposited overall, and subjected to a patterned etch so that specific silicon locations, such as the portion of polysilicon element 36 forming analog floating-gate electrode 2 (FIG. 2) will not become silicide-clad. In this embodiment of the invention, that dielectric material is constituted by silicide-block film 38.

Figure 3B:
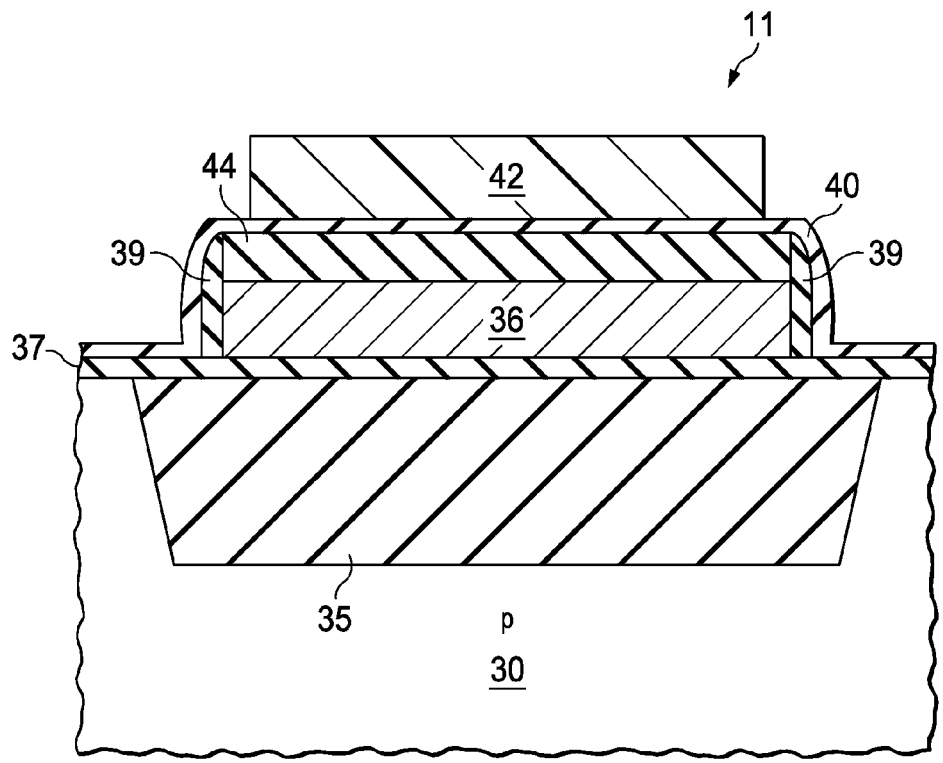

For example, referring to FIGS. 2 and 3b in combination, capacitor 11 is shown as an element in the same integrated circuit as analog floating-gate electrode 2, but is not electrically connected to analog floating-gate electrode 2. Capacitor 11 may serve, for example, as a capacitor within the same electrical circuit incorporating analog floating-gate electrode 2 or in another circuit. A lower plate of capacitor 11 is formed of another instance of polysilicon element 36, overlying isolation dielectric structure 35 and gate dielectric 37 (FIG. 3b). At this instance of capacitor 11, however, silicide-block film 38 is not present, having been removed from polysilicon element 36. As such, metal silicide 44 has been formed over polysilicon element 36, consuming some of polysilicon element 36. Sidewall nitride elements 39 preclude the formation of metal silicide 44 on the sidewalls of polysilicon element 36. Capacitor dielectric layer 40 is disposed over metal silicide 44, over which metal nitride plate 42 is deposited and patterned as shown. According to embodiments of this invention, and as will be described in further detail below, capacitor dielectric layer 40 may be constructed of silicon nitride, silicon dioxide, or a combination of the two; alternatively, other dielectric materials may be used as part or all of capacitor dielectric layer 40.

It has been discovered, in connection with this invention, that the formation of metal silicide 44 at the surface of analog floating-gate electrode 2 is not conducive to long-term retention of charge. In this regard, it has been discovered that some residue of unreacted metal (or, in some cases, metal nitride or other reactive products between the deposited metal and the gas constituents of the environment in which the direct reaction takes place) often remains at locations adjacent to metal silicide 44 structures at transistor gates, capacitor plates, etc. This residue can be at least partially conductive in many instances, even if vanishingly thin or present merely as filaments. For elements involved in switching operation of the integrated circuit, such as transistor gates and interconnects, the conductivity of this residue is generally sufficiently poor that any deleterious effects are not measurable or noticeable, especially relative to the significant increase in conductivity of the silicide-clad gate level structures. But in analog floating-gate functions, as described above, the setting of trim or reference levels at manufacture is intended to remain stable over the useful life of the integrated circuit. It has been discovered that charge trapped at a silicide-clad polysilicon capacitor plate in an analog floating-gate structure is vulnerable to long-term leakage. The loss of this charge will, of course, alter the operation of circuits relying on the programmed adjustment or setting of charge at such a structure.

As described in copending and commonly assigned U.S. application Ser. No. 13/070,222, filed Mar. 23, 2011, entitled "Low Leakage Capacitor for Analog Floating-Gate Integrated Circuits", incorporated herein by reference, a layer of silicon dioxide is used as a silicide block film over an analog floating-gate structure, and selectively removed from those polysilicon structures that are intended to be silicided. Another approach considered for a silicide block film uses an O—N—O film, with the lower two layers formed from the same films that define sidewall filaments along the polysilicon gate structures; silicon dioxide serves as the top layer of this silicide block film in this approach. These approaches allow the implementation of silicide cladding on some silicon structures in the same integrated circuit while still enabling long-term charge retention at analog floating-gate structures in the same integrated circuit.

It has been discovered, however, according to this invention, that some subsequent process steps involved in silicidation of unrelated polysilicon structures such as capacitor 11 of FIG. 2 can degrade exposed silicon dioxide in a silicide block overlying polysilicon element 36. For example, during such time as the silicon dioxide silicide-block film remains at those portions of polysilicon element 36 to be protected from silicidation, a sputter cleanup of the exposed portions of polysilicon to be silicided is performed prior to deposition of the silicide metal. Following silicidation, a chemical strip is performed to remove the unreacted silicide metal, including at locations such as overlying the silicon dioxide silicide-block film itself. In some cases, rework of the silicidation process is required, causing these cleanup and strip processes to be repeated. Each of these processes has been observed to thin the silicon dioxide silicide-block film overlying the eventual analog floating-gate electrode. Because the silicon dioxide silicide-block film is part of the capacitor dielectric of the storage capacitor, this thinning can degrade the long term data retention performance of the analog floating-gate structure.

To ensure adequate data retention performance of the analog floating-gate structure in light of this thinning of the silicon dioxide silicide-block film, prior approaches have considered increasing the thickness of the subsequent (i.e., post-silicidation) capacitor dielectric film that will overlie the remaining silicon dioxide silicide-block film, and that will also serve as the capacitor dielectric for unrelated silicided poly-to-metal capacitors (such as capacitor 11 of FIG. 2). Unfortunately, this increase in capacitor dielectric thickness reduces the resulting capacitance of the silicided poly-to-metal capacitors, reducing the circuit performance of those structures. This "linkage" between data retention of the analog floating-gate structure and capacitance of the silicided poly-to-metal capacitors thus prevents optimization of each of those parameters, necessitating a tradeoff on the part of the circuit designer and process engineering staff. Furthermore, because the thinning effect can vary from wafer to wafer, due to variations in cleanup and strip timing and processes, as well as the possibility of rework, the data retention and capacitance performance can widely vary over a large population of manufactured integrated circuits.

According to this embodiment of the invention, therefore, silicide-block film 38 is constructed to include a top layer of silicon nitride overlying a layer of silicon dioxide. As will be described in detail below, the silicon nitride serves to prevent thinning of silicide-block film 38 by subsequent processes, such as those involved in direct react silicidation. In addition, this construction of silicide-block film 38 allows its optimization to be independent of the optimization of capacitor dielectric layer 40 for silicided poly-to-metal capacitors elsewhere in the integrated circuit. Both data retention and circuit performance can thus be maximized, without trading one off against the other.

Figure 4:
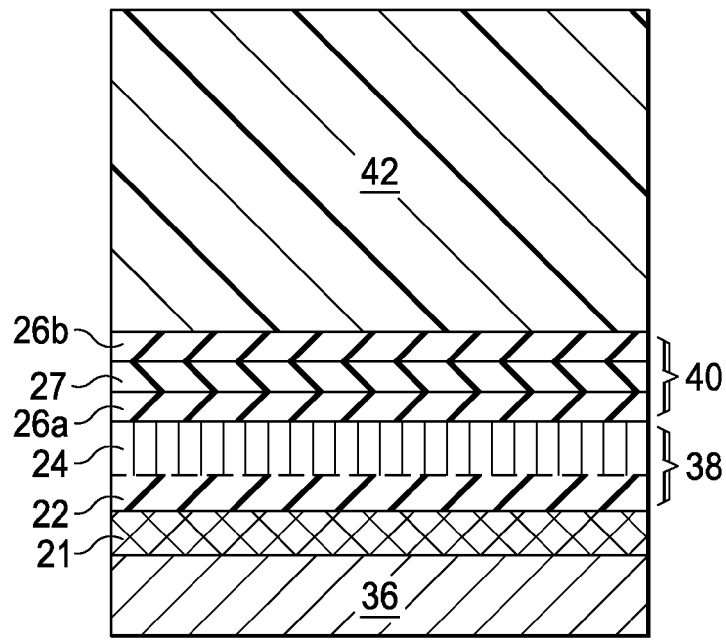
FIG. 4 is a cross-sectional view of the capacitor of FIG. 3a, shown in enhanced detail, and according to an embodiment of the invention.

FIG. 4 illustrates a portion of storage capacitor 6 in further cross-sectional detail, to illustrate the construction of silicide-block film 38 and capacitor dielectric layer 40 as formed according to an embodiment of the invention. In this example, silicide-block film 38 and capacitor dielectric layer 40 are disposed between polysilicon element 36 and metal nitride layer 42, as described above. In this example, thin (e.g., on the order of 40 Å) doped silicon dioxide layer 21 is present at the surface of polysilicon element 36, as a native oxide or other by-product of the overall manufacturing process. This doped silicon dioxide layer 21 contains the dopant species present in the underlying polysilicon element 36, for example phosphorous or arsenic (or both) for n-type polysilicon. In some cases, doped silicon dioxide layer 21 may not be present or observable at the surface of polysilicon element 36.

As shown in FIG. 4, silicide-block film 38 according to this embodiment of the invention overlies polysilicon element 36, and doped silicon dioxide layer 21, if present. In this embodiment of the invention, silicide-block film 38 includes silicon dioxide layer 22 overlying and abutting doped silicon dioxide layer 21. Silicon dioxide layer 22 constitutes the bulk of the thickness of silicide-block film 38 in this example, having a thickness of on the order of 350 Å. Silicon nitride layer 24 overlies silicon dioxide layer 22, and has an as-deposited thickness of on the order of 150 Å in this example. According to embodiments of this invention, silicon dioxide layer 22 within silicide-block film 38 may be annealed following its deposition, and prior to deposition of silicon nitride layer 24. Silicide-block film 38 may include additional material layers, or layers of differing thicknesses from those described above, according to variations that will be apparent to those skilled in the art having reference to this specification. In any case, it is contemplated that silicon nitride layer 24 will be the top layer of silicide-block film 38, and will therefore be exposed to subsequent processing including those involved in silicidation. These processes may thin silicon nitride layer 24 to some extent. However, it is contemplated that silicon nitride layer 24 will generally be protective of the overall silicide-block film 38, and any thinning that occurs will be much less than the thinning of silicon dioxide in prior approaches, considering silicon nitride is significantly more resistive to cleanups, strips, and other processes than is silicon dioxide.

Capacitor dielectric layer 40 in this embodiment of the invention is constructed of multiple layers of dielectric material. In this example, silicon nitride layer 26a directly overlies silicide-block film 38, directly in contact with silicon nitride layer 24. Silicon dioxide layer 27 directly overlies silicon nitride layer 26a, and silicon nitride layer 26b directly overlies silicon dioxide layer 27. Each of silicon nitride layer 26a, silicon dioxide layer 27, and silicon nitride layer 26b have a thickness on the order of 100 Å in this example. Metal nitride layer 42, for example composed of tantalum nitride of a thickness of on the order of 650 to 700 Å, overlies capacitor dielectric layer 40.

According to this embodiment of the invention, and as described above relative to FIGS. 3a and 3b, silicide-block layer 38 is not present between polysilicon electrode 36 (which is clad with metal silicide 44) and metal nitride layer 42 at capacitor 11; rather, only capacitor dielectric layer 40 is disposed between those layers at capacitor 11. According to embodiments of this invention, because silicide-block film 38 is sufficiently robust to subsequent processes, the structure and composition of capacitor dielectric layer 40 can be selected to optimize the capacitance and electrical behavior of capacitor 11 and other silicided poly-to-metal capacitors in the integrated circuit, independently from concern over data retention of analog floating-gate structure 2. In the example of FIG. 4, capacitor dielectric layer 40 formed of the combination of silicon nitride layer 26a, silicon dioxide layer 27, and silicon nitride layer 26b provides excellent capacitance and performance in circuit applications.

Figure 3C:
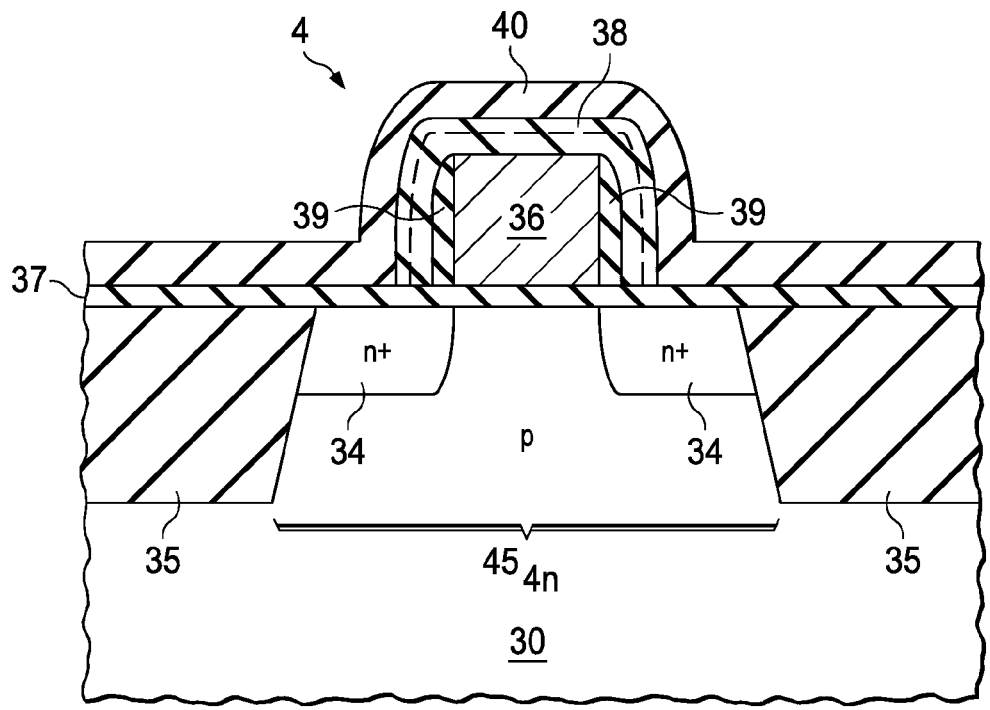
Figure 3D:
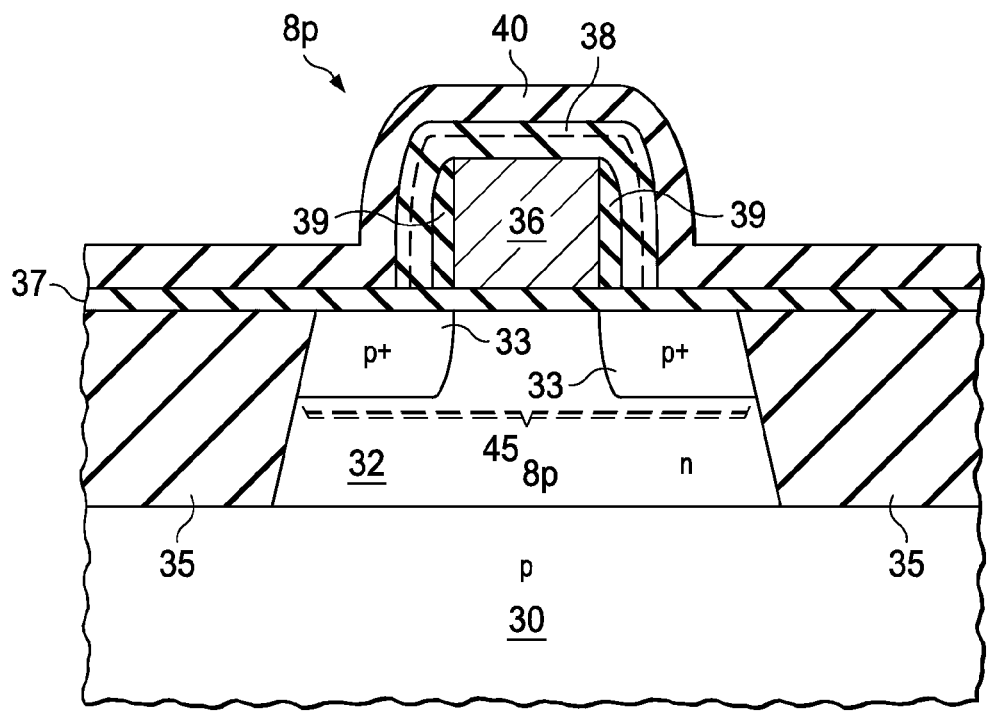
Figure 3E:
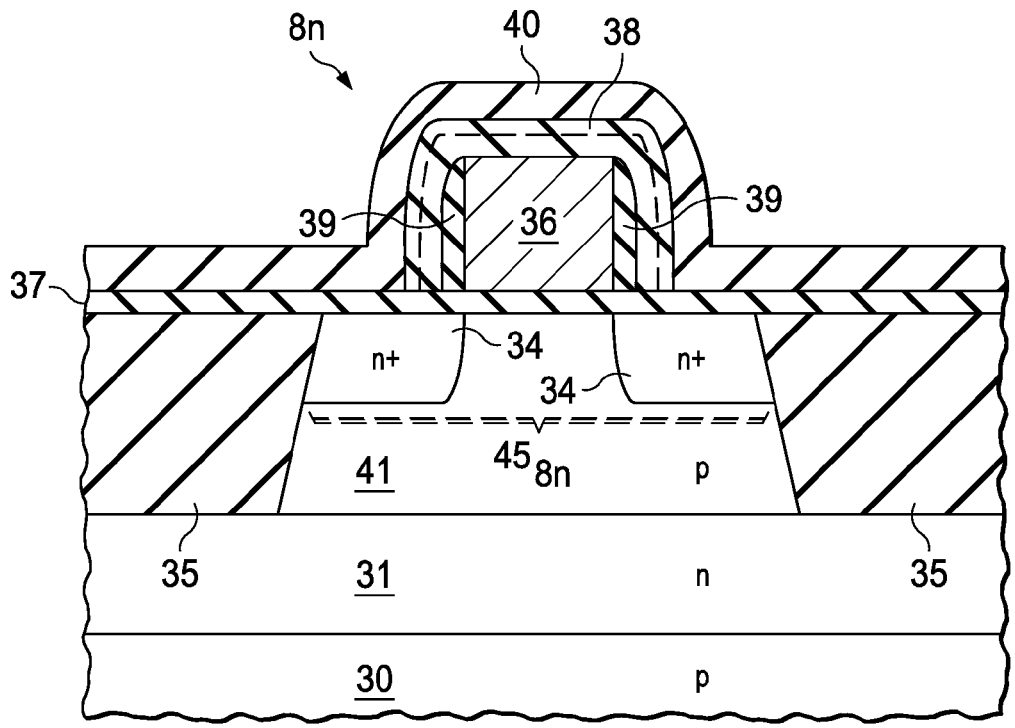

FIGS. 3c through 3e illustrate other portions of analog floating-gate electrode 2, namely transistor 4 and tunnel capacitors 8p, 8n according to this embodiment of the invention. As shown in FIG. 2, the portion of polysilicon element 36 defining analog floating-gate electrode 2 overlying active region $45_{4n}$ defines a gate electrode of an n-channel MOS transistor, with gate dielectric 37 disposed between polysilicon electrode 36 and the surface of active region $45_{4n}$, as shown. Silicide-block film 38 protects polysilicon electrode 36 from silicidation. Capacitor dielectric layer 40 are disposed overall, as shown in FIG. 3c. Heavily-doped n-type source/drain regions 34 are formed into p-type substrate 30, on opposite sides of polysilicon element 36 in the conventional self-aligned fashion. Sidewall nitride elements 39, on the sidewalls of polysilicon element 36, space the heavily doped source/drain implant from the edges of the gate; in the conventional manner, lightly-doped source/drain extensions may be present under sidewall nitride elements 39, having been implanted before the formation of that film.

Referring back to FIG. 2 and to FIG. 3d, the portion of analog floating-gate electrode 2 overlying active region $45_{8p}$ forms tunnel capacitor 8p, in this example. At tunnel capacitor 8p, polysilicon element 36 is separated from the surface of active region $45_{8p}$ by gate dielectric layer 37, which serves as the capacitor dielectric of tunnel capacitor 8p. Capacitor dielectric layer 40 is disposed overall. Active region $45_{8p}$ is at the surface of n-well 32, which is a relatively lightly-doped n-type region, formed at selected locations of the surface of substrate 30 in the manner known in the art. Heavily-doped p-type regions 33 are formed on opposite sides of polysilicon element 36 in this active region $45_{8p}$, in the conventional self-aligned manner for source and drain regions of p-channel MOS transistors.

Analog floating-gate electrode 2 also extends over active region $45_{8n}$, to form tunneling capacitor 8n, as shown in FIGS. 3 and 3e. In this location of the integrated circuit, polysilicon element 36 is also protected from silicidation by silicide-block film 38, which is disposed over the entirety of the structure. Gate dielectric 37 is disposed between polysilicon element 36 and the surface of active region $45_{8n}$ at this location of active region $45_{8n}$, serving as the capacitor dielectric of tunnel capacitor 8n. Capacitor dielectric layer 40 is disposed overall, as shown in FIG. 3e. The underlying structure of tunnel capacitor 8n differs from that of transistor 4 by the provision of n-type buried layer 31, disposed under the surface of active region $45_{8n}$. This buried layer 31 defines isolated p-well 41 which ends at a depth above that of n-type buried layer 31, and which is contained between isolation dielectric structures 35 as shown. P-well 41 is a relatively lightly-doped p-type region, as typical for well structures in the art. Heavily-doped n-type regions 34 are disposed on opposite sides of polysilicon element 36 in this active region $45_{8n}$, spaced apart from the gate edges by sidewall nitride elements 39.

While not shown in FIGS. 3c through 3e, top-side contacts to overlying metal conductors are provided in connection with tunneling capacitors 8p, 8n and transistor 4.

Many variations in the construction of this region of the integrated circuit relative to that described above are contemplated. It is contemplated that those skilled in the art having reference to this specification will be readily able to realize analog floating-gate electrode 2, including tunnel capacitors 8p, 8n, transistor 4, and storage capacitor 6, as appropriate for the particular circuit application, without undue experimentation.

Referring back to FIG. 2, a significant difference in relative area between tunneling capacitors 8p, 8n, on one hand, and storage capacitor 6, on the other hand, will be evident to those skilled in the art having reference to this specification. This difference in relative area will, of course, be reflected in the relative capacitances between these elements. Of course, differences in the capacitor dielectric materials, and thicknesses, will also be reflected in those capacitances. In any event, it is desirable that the capacitance of storage capacitor 6 is substantially larger than the capacitances of tunnel capacitors 8n, 8p (and also the parasitic gate-to-active capacitance of transistor 4), to facilitate tunneling of electrons at reasonable bias voltages (thus avoiding damage or breakdown). This disparity in capacitive coupling is contemplated to provide excellent programming and erasure (i.e., tunneling) performance.

In this structure, the use of silicide-block film 38 overlying polysilicon element 36 in forming analog floating-gate electrode 2 enables outstanding long-term retention of electrons by that structure, without risking charge leakage via silicidation residue and the like. This invention provides that outstanding data retention performance, while also enabling the optimization of capacitance for unrelated silicided poly-to-metal capacitor 11, and without unduly complicating the manufacturing process flow involved in construction of the integrated circuit.

Figure 5:
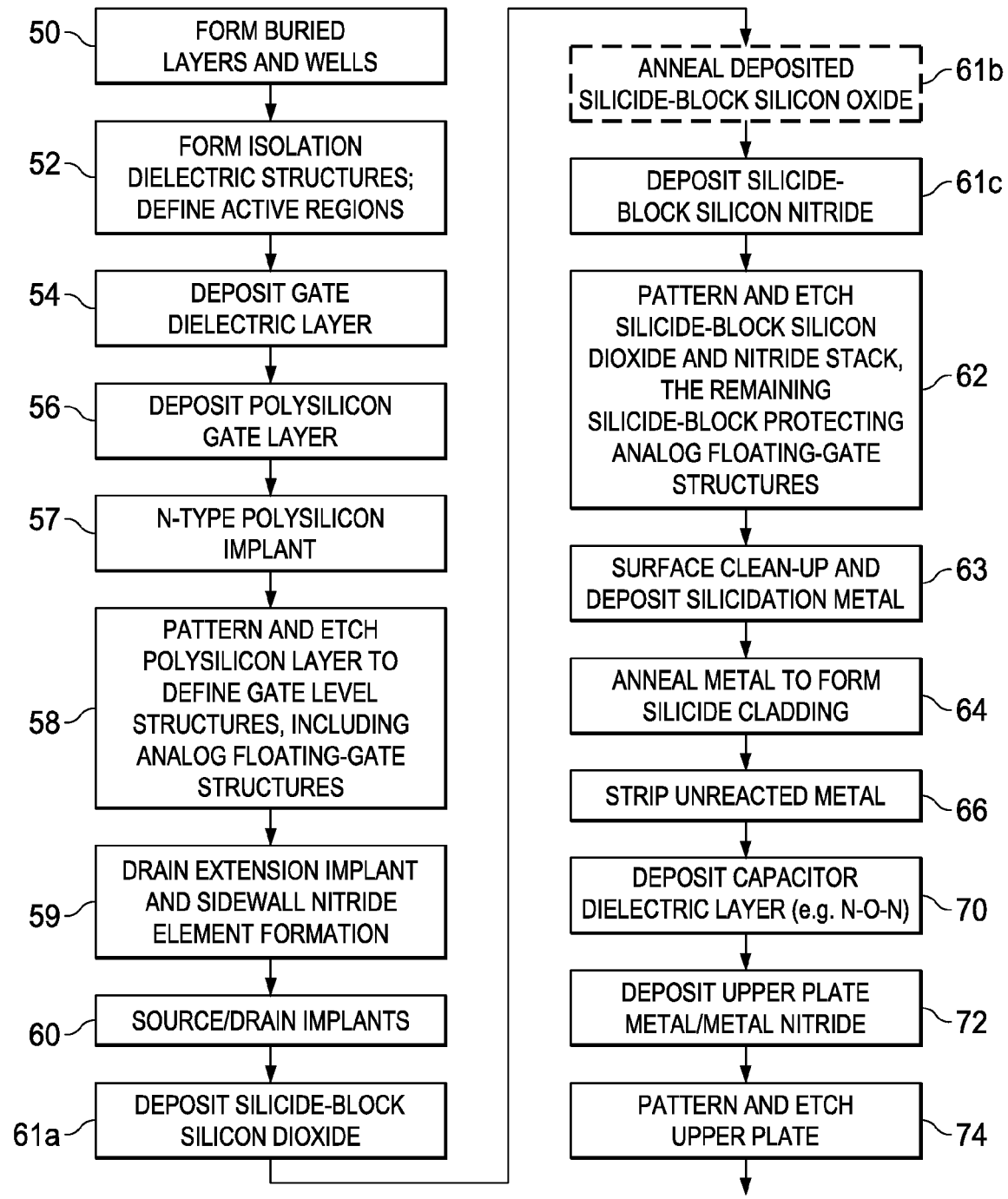
FIG. 5 is a flow diagram illustrating an example of the manufacturing process for fabricating the device of FIGS. 2 and 3a through 3e, according to an embodiment of the invention.

A process of manufacturing integrated circuits including analog floating-gate element 2 and unrelated silicided poly-to-metal capacitor 11, according to an embodiment of the invention, will now be described in connection with FIG. 5. For the example of the process shown in FIG. 5, these structures will be fabricated to include silicide-block film 38 as shown in FIG. 4 and described above. It is contemplated that those skilled in the art having reference to this specification will be readily able to incorporate such variations and modifications to this process as appropriate for a particular implementation or variation to the example of FIG. 5, such variations and modifications being within the scope of this invention as claimed, without undue experimentation.

According to embodiments of this invention, manufacture of the integrated circuit including analog floating-gate electrode 2 begins with process 50, in which various doped regions are defined and formed into the semiconducting surface of substrate 30. These doped regions include regions such as n-type buried layer 31, n-type well 32, p-type well 41, as shown in FIGS. 3d and 3e, and the like, depending on the desired eventual structures. In process 52, isolation dielectric structures 35 are formed at selected locations of the surface. These isolation dielectric structures 35 may be formed in various conventional ways, including shallow trench isolation, deep trench isolation, local oxidation of silicon (LOCOS), and the like. As known in the art, the formation of isolation dielectric structures 35 serve to define the location of active regions of the semiconducting surface, at which transistors and some capacitors (including tunnel capacitors 8p, 8n in embodiments of the invention described above) are formed. While process 50 is shown as preceding process 52 in this example, in some manufacturing flows, the order of these steps may be reversed; further in the alternative, some wells and buried layers may be formed prior to isolation dielectric structures 35, with others formed after the formation of those isolation dielectric structures.

Following the definition of active regions at the surfaces of the desired well or wells (processes 50, 52), gate dielectric layer 37 is then formed in process 54. Gate dielectric 37 may be a deposited insulator, such as silicon dioxide, especially in modern sub-micron manufacturing processes with constrained thermal budgets. Alternatively, gate dielectric layer 37 may be formed by thermal oxidation of silicon, in the conventional manner. Following the formation of gate dielectric layer 37 in process 54 (and any desired threshold adjust ion implantation etc.), a polycrystalline silicon layer from which polysilicon elements 36 are to be formed is then deposited overall, in process 56.

In process 57, the polysilicon layer deposited in process 56 is doped n-type, by way of an ion implant of the appropriate species. In this example, in which MOS transistor 4 is n-channel, the entirety of the polysilicon layer including polysilicon element 36 receives the implant of process 57. If p-channel MOS transistors are to be formed with gate electrodes in this polysilicon level (such transistors preferably including p-type polysilicon gate electrodes), then the implant of process 57 will be a patterned implant. Alternatively, doping process 57 may be performed in situ with the deposition of polysilicon layer in process 56. In process 58, polysilicon elements 36 are photolithographically patterned and etched, defining the various structures in the eventual integrated circuit that are to be formed in this layer, including analog floating-gate electrode 2, and other structures such as the silicide-clad lower plate of capacitor 11 (FIGS. 3 and 4b), transistor gates, and the like. While doping process 57 is shown in this process flow as occurring prior to etch process 58, polysilicon elements 36 may instead be doped after the patterned etch of process 58.

As will be described below, doping of polysilicon elements 36 may also be performed later in the process, for example by way of the same implants used to form transistor source and drain regions.

In this example, in which graded source/drain junctions are implemented as typical in modern CMOS manufacturing, a drain extension implant (also referred to as "lightly-doped-drain", or LDD, implant) is performed in a self-aligned manner relative to the remaining polysilicon features overlying active areas, in process 59. If desired, the LDD implant may be performed for both n-channel and p-channel transistors, by way of masked implants. Following the drain extension implant, a silicon nitride layer is then deposited overall and etched anisotropically, also in this process 59, to form sidewall nitride elements 39 (FIGS. 3b through 4e) on the sidewalls of polysilicon structures including polysilicon elements 36. Once sidewall nitride elements 39 are formed in this manner, masked source/drain implants of both n-type and p-type are then performed, in process 60, self-aligned to the gate level structures within the respective active regions 45, in the usual manner. Process 60 may also include the appropriate anneal or other high-temperature drive-in process to place the implanted dopant at the desired depth.

According to embodiments of this invention, as described above, analog floating-gate electrode 2 is protected from direct react silicidation by silicide-block film 38, while other structures (the lower plate of capacitor 11, transistor gates, polysilicon interconnects, etc.) that are to be silicide-clad will not be so protected. Formation of silicide-block film 38 in this embodiment of the invention follows source/drain implant processes 59, 60, beginning with the deposition of silicon dioxide layer 22 overall in process 61a. As mentioned above, for sub-micron manufacturing technology, silicon dioxide layer 22 may be deposited to a thickness of on the order of 350 Å. In process 61c, silicon nitride layer 24 is then deposited over silicon dioxide layer 22, for example to a thickness of on the order of 150 Å. Deposition processes 61a, 61c may be carried out by way of conventional chemical vapor deposition (CVD), plasma enhanced if desired.

It has been discovered, in connection with this invention, that a post-deposition anneal of silicon dioxide layer 22 can improve its properties, considering subsequent processes to which silicide-block film 38 will be exposed. More specifically, it is believed that such an anneal can drive out hydrogen that may be present in silicon dioxide layer 22 as deposited. As such, optional anneal process 61b can be performed following oxide deposition process 61a and prior to nitride deposition process 61c, either by way of a conventional furnace anneal (e.g., at a temperature on the order of 600° C. for on the order of thirty minutes) or by way of an equivalent rapid thermal anneal (RTA).

In process 62, silicide-block film 38 as deposited in processes 61a, 61b is photolithographically patterned and etched. According to embodiments of this invention, as described above, silicide-block film 38 is removed from those locations and instances of polysilicon element 36 that are to be silicide-clad, while retained at analog floating-gate electrode 2 and other elements that are not to be silicide-clad. It is contemplated that, in most implementations, most if not all polysilicon gate-level structures other than structures serving the function of analog floating-gate electrodes 2 will be silicide-clad, and as such will have silicide-block film 38 removed therefrom in process 62. At this stage of the process, the top surface of silicon nitride layer 24 is exposed at the remaining locations of silicide-block film 38.

Following etch process 62, the then-exposed wafer surface (including the polysilicon and silicon to be silicided, and also silicide-block film 38 where retained) is subjected to a plasma clean-up process, followed by deposition of the silicidation metal overall, in process 63. In the embodiments of this invention described above, the metal deposited in process 63 is cobalt; other silicidation metals such as titanium, tungsten, and the like may alternatively be used. In process 64, a high temperature anneal is performed to react this deposited metal at those locations at which the metal is in contact with underlying silicon (e.g., at the lower plate of capacitor 11) to form cladding 44 of a metal silicide compound, as shown in FIG. 3b. Conversely, those silicon structures that are not in contact with the silicidation metal, such as analog floating-gate electrode 2 at which silicide-block film 38 remains after process 62, will not react with the deposited metal. Following the silicidation anneal of process 64, a conventional etch or strip is performed in process 66 to remove the unreacted metal and byproducts from the surface, leaving silicide cladding 44 behind wherever formed.

Capacitor dielectric layer 40 is then formed, in process 70. As described above, capacitor dielectric layer 40 serves as the capacitor dielectric of capacitor 11 and in the capacitor dielectric of storage capacitor 6, and is contemplated to be a relatively high quality dielectric, providing high capacitance per unit area. In this example, as described above in connection with FIG. 4, capacitor dielectric layer 40 is formed in process 70 by the sequential deposition of silicon nitride layer 26a, silicon dioxide layer 27, and silicon nitride layer 26b, each to a thickness of on the order of 100 Å. Alternatively, other dielectric materials and combinations, and thicknesses, can be used as this insulating film. According to embodiments of this invention, however, the thickness and composition of capacitor dielectric layer 40 can be selected in a manner that optimizes the capacitance and other electrical properties of structures such as capacitor 11, without concern for the data retention performance of storage capacitor 6 that also includes silicide-block film 38 in its capacitor dielectric. Good data retention of storage capacitor 6 is maintained by the integrity of silicide-block film 38, and its resistance to thinning in subsequent processes, without relying on capacitor dielectric layer 40.

In process 72, the upper plate metal or metal compound for storage capacitor 6 and capacitor 11 is deposited overall in process 72. According to one example of embodiments of this invention, the material deposited in process 72 is tantalum nitride (TaN). Alternatively, another conductive material comprised of a metal, including elemental metal and also metal compounds such as metal nitrides, may be deposited in process 72 and serve as the upper plate of these devices. In process 74, this metal or metal compound layer is photolithographically patterned and etched to define the upper plates of storage capacitor 6 and capacitor 11, as well as other elements including metal interconnects, capacitor plates, bond pads, and the like.

Following process 74, the integrated circuit including analog floating-gate electrode 2 constructed according to embodiments of this invention is then completed by way of the appropriate processing steps for its other structures and elements, including the formation of insulating layers, etching of contacts, formation of metal or other conductor layers making contact to the elements described above, including the top-side contacts to the doped active regions of tunnel capacitors 8p, 8n, and the like, in the conventional manner. It is contemplated that those skilled in the art having reference to this specification will be readily able to implement those additional process steps as appropriate for the particular manufacturing process technology and the desired construction of the integrated circuit.

Embodiments of this invention provide important advantages in the fabrication of integrated circuits, including analog integrated circuits, circuits including adjustable or trimmable elements, such as reference circuits, and EEPROM memory circuits. More particularly, embodiments of this invention provide a floating-gate electrode structure including an unsilicided polysilicon plate, and a method of fabricating the same, in an integrated circuit that also includes silicided poly-to-metal capacitors formed in the same structural levels. The resulting floating-gate electrode structure can be programmed and erased to precisely set an adjustable level of trapped charge that can define a particular analog level for an electronic circuit. This structure is capable of retaining that trapped charge for long periods of time, and as such is suitable for use as an element that is trimmable or adjustable at manufacture. In addition, this structure can be constructed in a manner that is compatible with existing manufacturing process flows, without unduly complicating the process flows required.

More particularly, it is contemplated that the silicide-block film provided by embodiments of this invention, that film remaining as part of the dielectric of the floating-gate structure, is capable of maintaining its physical integrity and thus the data retention capability of the floating-gate structure itself, while enabling the independent optimization of the capacitor dielectric for the silicided poly-to-metal capacitors elsewhere in the integrated circuit. The silicide-block film of embodiments of this invention is believed to provide this benefit by way of its composition, which is relatively impervious to cleanup and strip processes involved in the silicidation of the structure. By maintaining the thickness of the silicide-block film despite these subsequent processes, a thinner overlying capacitor dielectric film can be used, improving the electrical performance of the silicided poly-to-metal capacitors.

In addition, however, it is believed that the composition of the silicide-block film according to embodiments of this invention further enhance the data retention of the floating-gate structures relative to those using solely a silicon dioxide silicide-block film. For the example described above, in which the silicide-block film includes a silicon nitride layer overlying an annealed silicon dioxide layer, it is believed that this construction also serves to reduce thermionic-field carrier injection, by altering the electric field profile across the resulting dielectric film. In addition, it is contemplated that the mobility of carriers through the resulting dielectric film is reduced by this construction of the silicide-block film, by way of the mechanisms of carrier scattering at the various layer interfaces, and also by trapping of those carriers crossing the dielectric film.

Figure 6:
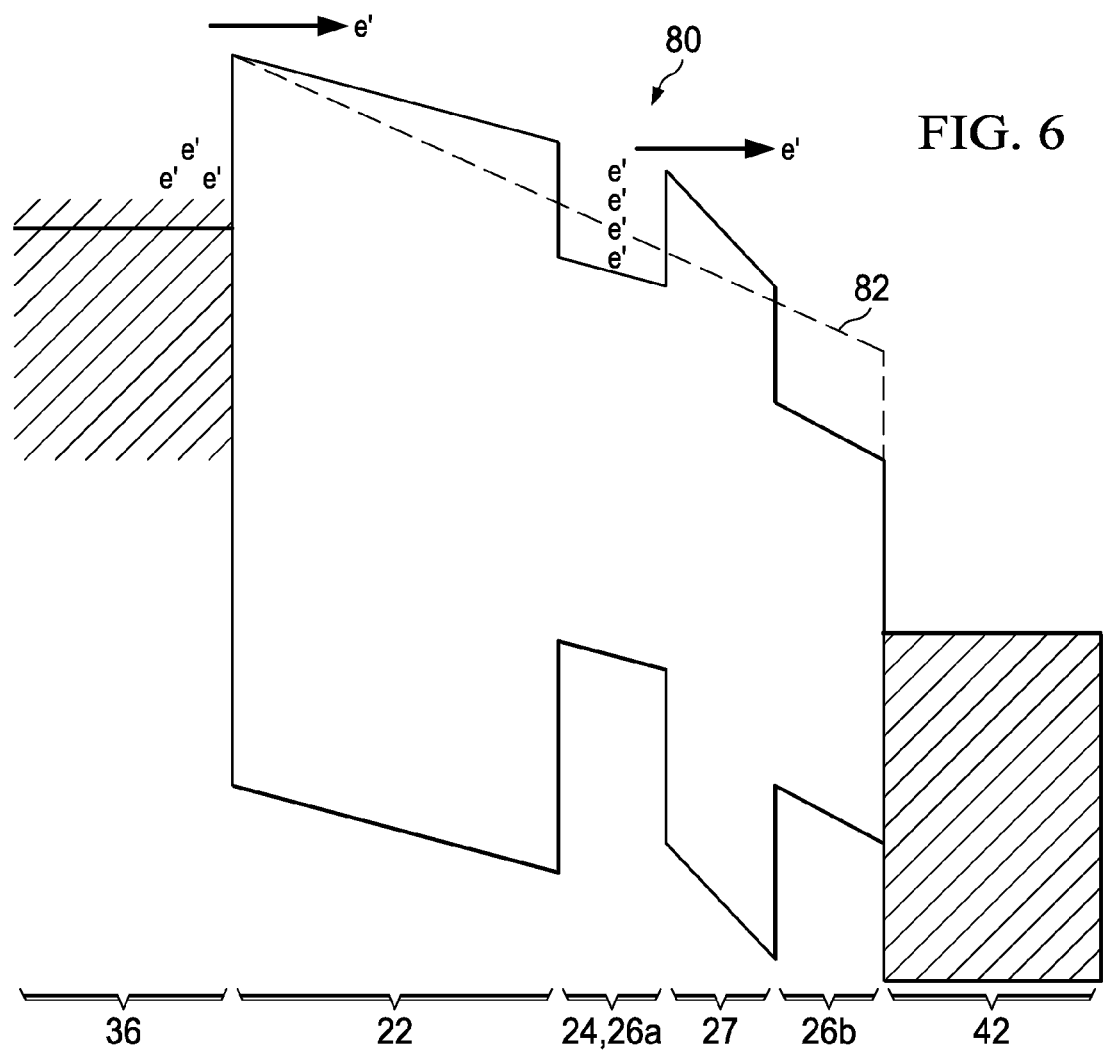
FIG. 6 is an energy diagram corresponding to a silicide-block film and capacitor dielectric in the device of FIG. 2 according to an embodiment of the invention.

FIG. 6 shows a qualitative energy diagram for an example of the silicide-block film according to embodiments of this invention. In this example, silicide-block film 38 includes silicon dioxide layer 22 and silicon nitride layer 24, as described above. In this example, capacitor dielectric layer 40 is an N—O—N film including silicon nitride layer 26a, silicon dioxide layer 27, and silicon nitride layer 26b, each with a thickness on the order of 100 Å. The corresponding film thicknesses in FIG. 6 are indicated by the reference numerals for those layers, between those of polysilicon electrode 36 and metal nitride layer 42. However, because silicon nitride layer 24 of silicide-block film 38 and lower silicon nitride layer 26a of capacitor dielectric layer 40 are both silicon nitride, the two films are indistinguishable in this energy diagram. As shown in this FIG. 6, electrons traveling from polysilicon electrode 36 through silicon dioxide layer 22 will tend to become trapped in energy trough 80 corresponding to overlying silicon nitride layer 24 and lower silicon nitride layer 26a. To travel to metal nitride layer 42, those trapped electrons would have to overcome the additional energy barrier at the interface between silicon nitride layer 26a and overlying silicon dioxide layer 27 within capacitor dielectric layer 40. For comparison, energy profile 82 shown by the dashed lines in FIG. 6 corresponds to a silicon dioxide layer disposed between polysilicon electrode 36 and metal nitride layer 42; no energy trough serving to trap electrons is present in that film. Corresponding improvement in data retention performance has been observed by way of experiment, in which both n-type and p-type unsilicided poly-to-metal capacitors with silicide-block films constructed according to an embodiment of this invention exhibited minimal programmed voltage loss following high temperature bakes (e.g., 200° C. bake for 24 hours).

While the present invention has been described according to its embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an electrically programmable capacitor structure for an analog semiconductor integrated circuit, formed at a semiconductor surface of a body, comprising the steps of:
    forming isolation dielectric structures at locations of the semiconductor surface, the isolation dielectric structures defining active regions of the surface therebetween;
    then forming an electrode layer comprised of polycrystalline silicon overall;
    then depositing, on the electrode layer, a silicide-block film comprising a first layer of silicon dioxide underlying a first layer of silicon nitride;
    selectively removing the silicide-block film from a portion of the electrode layer so that the silicide-block film remains over a portion of the electrode layer corresponding to a first electrode with the first layer of silicon nitride at an exposed surface, and is removed from a portion of the electrode layer corresponding to a second electrode;
    then reacting exposed portions of the polycrystalline silicon electrode layer, including the portion corresponding to the second electrode, with a metal to form a metal silicide;
    then depositing a capacitor dielectric film overall;
    then depositing a conductor layer comprising a metal; and
    removing portions of the conductor layer to define a first conductive plate overlying a portion of the first electrode at a location overlying an isolation dielectric structure, with the capacitor dielectric film and the silicide-block film therebetween, and to define a second conductive plate overlying a portion of the second electrode with the capacitor dielectric film therebetween.

2. The method of claim 1, further comprising:
    after the step of selectively removing the silicide-block film, and before the reacting step, forming a layer of the metal overall.

3. The method of claim 2, further comprising:
    after the reacting step, removing non-silicided portions of the metal.

4. The method of claim 2, further comprising:
after the step of selectively removing the silicide-block film, and before the step of forming the layer of the metal, performing a surface cleanup.

5. The method of claim 1, further comprising:
before the step of depositing the silicide-block layer, removing portions of the electrode layer to define the first and second electrodes, the first electrode including a portion overlying an isolation dielectric structure.

6. The method of claim 5, wherein the step of depositing the silicide-block layer comprises:
forming the first layer of silicon dioxide over the first and second electrodes; and
depositing the first layer of silicon nitride over the layer of first layer of silicon dioxide;
wherein the selectively removing step removes the first layer of silicon dioxide and the first layer of silicon nitride from the second electrode, so that the first layer of silicon dioxide and the first layer of silicon nitride remains over the first electrode.

7. The method of claim 6, further comprising:
after the step of forming the first layer of silicon dioxide, annealing the first layer of silicon dioxide.

8. The method of claim 1, wherein the conductor layer comprises a metal nitride.

9. The method of claim 8, wherein the metal nitride is tantalum nitride.

10. The method of claim 1, wherein the reacting step reacts polycrystalline silicon of the second electrode with cobalt to form cobalt silicide.

11. The method of claim 9, further comprising:
forming a gate dielectric layer over the active regions;
first electrode having a plurality of portions overlying active regions;
forming source and drain regions on opposite sides of a portion of the first electrode overlying a first active region.

12. The method of claim 11, wherein at least a portion of the first electrode overlies second and third active regions,
and wherein the step of forming source and drain regions also forms source and drain regions on opposite sides of a portion of the first electrode overlying the second and third active region.

13. The method of claim 1, wherein the step of depositing the capacitor dielectric film comprises:
depositing a second layer of silicon nitride overall;
then depositing a second layer of silicon dioxide overall; and
then depositing a third layer of silicon nitride overall.

* * * * *